(12) United States Patent
Hu et al.

(10) Patent No.: US 7,472,333 B2
(45) Date of Patent: Dec. 30, 2008

(54) ENCODING METHOD AND APPARATUS FOR CROSS INTERLEAVED CYCLIC CODES

(75) Inventors: Yi-Kwang Hu, Hsin-Chu (TW); Jin-Bin Yang, Hsin-Chu (TW); Hsi-Chia Chang, Hsin-Chu (TW)

(73) Assignee: MediaTek, Inc., Hsin-Chu (TW)

( * ) Notice: Subject to any disclaimer, the term of this patent is extended or adjusted under 35 U.S.C. 154(b) by 361 days.

(21) Appl. No.: 10/969,949

(22) Filed: Oct. 22, 2004

(65) Prior Publication Data
US 2005/0120285 A1 Jun. 2, 2005

(30) Foreign Application Priority Data
Nov. 28, 2003 (TW) ............... 92133575 A

(51) Int. Cl.
G06F 11/00 (2006.01)
H03M 13/00 (2006.01)
(52) U.S. Cl. .................. 714/781; 714/756
(58) Field of Classification Search .......... 714/781, 714/756
See application file for complete search history.

(56) References Cited

U.S. PATENT DOCUMENTS

| | | | |
|---|---|---|---|
| 5,341,396 A * | 8/1994 | Higgins et al. ............ 375/130 |
| 5,444,719 A * | 8/1995 | Cox et al. .................. 714/769 |
| 5,712,861 A * | 1/1998 | Inoue et al. ................ 714/752 |
| 6,219,816 B1 * | 4/2001 | Tezuka ....................... 714/784 |
| 6,532,267 B1 * | 3/2003 | Heegard ..................... 375/253 |
| 6,574,193 B1 * | 6/2003 | Kinrot ........................ 370/229 |
| 6,826,723 B2 * | 11/2004 | Fredrickson ............... 714/784 |
| 7,274,642 B2 * | 9/2007 | Sako et al. ............... 369/53.22 |
| 2002/0108088 A1 * | 8/2002 | Kim ........................... 714/784 |
| 2004/0114484 A1 * | 6/2004 | Sako et al. ............... 369/53.22 |

\* cited by examiner

Primary Examiner—M. Mujtaba K Chaudry

(57) ABSTRACT

The invention relates to an encoding method for encoding a codeword to obtain a parity code. The code is embedded in the codeword and divides the codeword to have intermediate symbol locations between a first and a second set of data symbols. Each data symbol forms a coefficient. The first and the second set of data symbols and the parity code respectively form a first polynomial (M1(x)), a second polynomial (M2(x)), and a parity code polynomial (R(x)). The method comprises: first, designing a first code generator polynomial (G1(x)); next, multiplying M1(x) by $x^4$ and dividing the product of M1(x)$^*x^4$ by G1(x) to obtain a first remainder polynomial (R1(x)); next, generating a second code generator polynomial (G2(x)) from G1(x); next, generating a third polynomial (M3(x)); next, multiplying M3(x) by $x^4$ and dividing the product of M3(x)$^*x^4$ by G2(x) to obtain a second remainder polynomial (R2(x)); next, performing an adding procedure to R1(x) and R2(x) to obtain R(x); finally, obtaining the parity code from each coefficient of R(x).

10 Claims, 3 Drawing Sheets

$R(x)$ : (Polynomial need to be calculated.)

$M_1(x)$ : $m_{23} X^{11} + m_{22} X^{10} + \ldots + m_{12}$ $M_2(x)$ : $m_{11} X^{11} + m_{10} X^{10} + \ldots + m_0$

ENCODING METHOD AND APPARATUS FOR CROSS INTERLEAVED CYCLIC CODES

BACKGROUND OF THE INVENTION

1. Field of the Invention

The present invention relates to an encoding method, especially to an encoding method of cross interleaved Reed-Solomon cyclic code (CIRC).

2. Description of the Prior Art

In the encoding method of a conventional data recording system, there are many kinds of methods to encode a codeword to obtain a corresponding parity code. A codeword comprises several data symbol. Conventional encoding method is to place the parity code at the end of these data symbol; however, the encoding calculation is quite complex and takes lots of time when the parity code is not at the end of data symbol. The encoding method of cross interleaved Reed-Solomon cyclic code (CIRC) is to place the parity code within these data symbols. Taking the CIRC RS(28, 24) of the compact disc standards for example, for a total of 24 data symbols and 4 parity codes desired to be generated at the end, the conventional encoding method of CIRC needs a total of 255 calculating cycles.

In conventional encoding method or encoding system, there is still plenty of room for improvement in terms of decreasing the calculating cycle and lowering system complexity.

SUMMARY OF THE INVENTION

The present invention provides an encoding method and apparatus of cross interleaved Reed-Solomon cyclic code (CIRC) to shorten the calculating cycle and decrease the system complexity.

In one embodiment, the present invention provides an encoding method for encoding a codeword to obtain a corresponding parity code. The parity code is embedded in the codeword and divides the codeword to have intermediate symbol locations between a first and a second set of data symbols. Each data symbol forms a coefficient. The two sets of data symbols and the parity code respectively form two polynomials (M1(x), (M2(x)) and a parity code polynomial (R(x)).

According to a desired parity resolution, a first code generator polynomial (G1(x)) is designed. Then, according to a predetermined reciprocal substitution procedure, a second code generator polynomial (G2(x)) is generated from the first code generator polynomial (G1(x)). Afterwards, a third polynomial (M3(x)) is generated, wherein the coefficients of the third polynomial (M3(x)) in the ascending order are in the reverse permuted order of the coefficients of the second polynomial (M2(x)) in the ascending order.

The first polynomial (M1(x)) is multiplied by $x^4$ first, and the product of M1(x)*$x^4$ is divided by the first code generator polynomial (G1(x)), so as to obtain a first remainder polynomial (R1(x)). Then, the third polynomial (M3(x)) is multiplied by $x^4$ first, and the product of M3(x)*$x^4$ is divided by the second code generator polynomial (G2(x)), so as to obtain a second remainder polynomial (R2(x)). Afterwards, an adding procedure is performed on the first remainder polynomial (R1(x)) and the second remainder polynomial (R2(x)) to obtain the parity code polynomial (R(x)). Finally, the parity code is obtained from each coefficient of the parity code polynomial (R(x)).

The encoding apparatus and method of the present invention is used for encoding a codeword by an encoding method of CIRC to obtain a corresponding parity code. By the method of the present invention, not only is the needed calculating cycle decreased, but the complexity of the system complexity decreased too.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
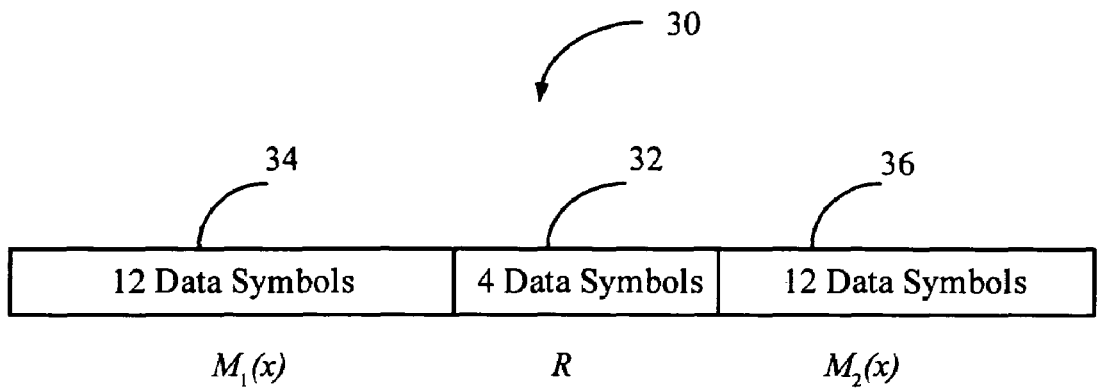
FIG. 1 is a schematic diagram of the encoding method according to the present invention.

Referring to FIG. 1, FIG. 1 is a schematic diagram of the encoding method according to the present invention. The encoding method of the present invention is used for encoding a codeword 30 to obtain a corresponding parity code 32. As shown in FIG. 1, in one embodiment, the codeword 30 is encoded by the encoding method of the cross interleaved Reed-Solomon cyclic code (CIRC), utilized in a compact disc. The parity code 32 is embedded in the codeword 30 and divides the codeword 30 to have intermediate symbol locations between a first set of data symbol 34 and a second set of data symbol 36. The first set of data symbol 34 and the second set of data symbol 36 respectively comprise 12 data symbols, and the parity code 32 comprises 4 data symbols.

Each data symbol forms a coefficient. The corresponding coefficients of the first set of data symbols 34 are $m_{23}$, $m_{22}$, $m_{21}$ . . . and $m_{12}$; the corresponding coefficients of the second set of data symbols 36 are $m_{11}$, $m_{10}$, $m_9$ . . . and $m_0$. The first set of data symbols 34, the second set of data symbols 36, and the parity code 32 respectively form a first polynomial (M1(x)), a second polynomial (M2(x)), and a parity code polynomial (R(x)), wherein R(x) is the polynomial desired to be obtained. Besides, a third polynomial (M3(x)) is generated by reverse permuting the coefficients of the second polynomial (M2(x)), wherein the coefficients of the third polynomial (M3(x)) in the ascending order are in the reverse permuted order of the coefficients of the second polynomial (M2(x)) in the ascending order. Each polynomial is expressed as follows:

the first polynomial is $M1(x)=m_{23}x^{11}+m_{22}x^{10}+\ldots+m_{13}x+m_{12}$;

the second polynomial is $M2(x)=m_{11}x^{11}+m_{10}x^{10}+\ldots+m_1x+m_0$;

the third polynomial is $M3(x)=m_0x^{11}+m_1x^{10}+\ldots+m_{10}x+m_{11}$.

Each data symbol is an 8-bit digital data, and the value of each data symbol is selected from 0 to 255. The values of the data symbols are mapped in correspondence to the elements of a Galois Field ($GF(2^8)$) through a predetermined mapping relationship. The values of the data symbols range from 0 to 255 and are respectively mapped to the 256 corresponding elements (0, $\alpha^0$, $\alpha^1$ . . . $\alpha^{254}$) of the $GF(2^8)$. That means, the coefficients (m0 . . . m23) are all selected from the elements (0, $\alpha^0$, $\alpha^1$ . . . $\alpha^{254}$) of the $GF(2^8)$.

Beside the CIRC utilized in a compact disc, the encoding method of the present invention can also be used in other applications in which the concept is the CIRC, and the data symbols can be random bit digital data.

In the encoding method of the present invention, a first code generator polynomial (G1(x)) is designed according to a desired parity resolution, wherein $G1(x)=(x+\alpha^0)(x+\alpha^1)(x+\alpha^2)(x+\alpha^3) = \alpha^6\alpha^{78}x+\alpha^{249}x^2+\alpha^{75}x^3+x^4$. Moreover, according to a reciprocal substitution procedure, a second code generator polynomial (G2(x)) is generated from the first code generator polynomial (G1(x)), wherein the reciprocal substitution procedure is to select the reciprocal of $\alpha^0$, $\alpha^1, \alpha^2$, and $\alpha^3$ of $G1(x)(x+\alpha^0)(x+\alpha^1)(x+\alpha^2)(x+\alpha^3)$ and makes G2(x) as $G2(x)=(x+\alpha^0)(x+\alpha^{-1})(x+\alpha^{-2})(x+\alpha^{-3})$. After multiplying G2(x), the coefficients are correspondingly mapped to the elements (0, $\alpha^0$, $\alpha^1$ ... $\alpha^{254}$) of the $GF(2^8)$, so as to obtain $G2(x)=(x+\alpha^0)(x+\alpha^{-1})(x+\alpha^{-2})(x+\alpha^{-3}) =\alpha^{249}+\alpha^{69}x+\alpha^{243}x^2+\alpha^{72}x^3+x^4$.

The first polynomial (M1(x)) is multiplied by $x^4$ first, and the product of $M1(x)^*x^4$ is divided by the first code generator polynomial (G1(x)) to obtain a first remainder polynomial (R1(x)). Then, the third polynomial (M3(x)) is multiplied by $x^4$ first, and the product of $M3(x)^*x^4$ is divided by the second code generator polynomial (G2(x)) to obtain a second remainder polynomial (R2(x)). Furthermore, an adding procedure is performed on the first remainder polynomial (R1(x)) and the second remainder polynomial (R2(x)), so as to obtain the parity code polynomial (R(x)). Finally, the parity code 32 is obtained from each coefficient of the parity code polynomial (R(x)).

In the encoding method of the present invention, the values of the data symbols are replaced by the 256 elements (0, $\alpha^0$, $\alpha^1$ ... $\alpha^{254}$) of the $GF(2^8)$, which will be the coefficients for later calculations of the polynomials. After obtaining the parity code polynomial (R(x)) by the elements of the $GF(2^8)$, with the coefficients of each terms of the obtained parity code polynomial (R(x)), the present invention obtains the corresponding values through the mapping relationship, so as to form the parity code 32.

The above-mentioned first code generator polynomial (G1(x)) and the second code generator polynomial (G2(x)) are not the only ones. They can be expressed as $G1(x)=C_1(x+\alpha^0)(x+\alpha^1)(x+\alpha^2)(x+\alpha^3)$ and $G2(x)=C_2(x+\alpha^0)(x+\alpha^{-1})(x+\alpha^{-2})(x+\alpha^{-3}$ wherein $C_1$ and $C_2$ can be one of the elements (0, $\alpha^0$, $\alpha^1$ ... $\alpha^{254}$) of the $GF(2^8)$. That means different G1(x) corresponds to a G2(x).

Besides, in the encoding method of the present invention, the higher the desired parity resolution is, the more terms the first code generator polynomial has, and the longer the parity code 32 becomes.

The encoding method of the present invention is applied in a first encoding circuit and a second encoding circuit (not shown in FIG. 1). The detailed description of the adding procedure is as follows. First, 16 inputs ($m_{23}$, $m_{22}$ ... $m_{13}$, $m_{12}$, 0, 0, 0, 0) are received sequentially by the first encoding circuit, then 16 outputs are generated correspondingly, and the last 4 outputs as $R_3^{(1)}$, $R_2^{(1)}$, $R_1^{(1)}$, and $R_0^{(1)}$ are defined respectively; the first remainder polynomial (R1(x)) is then formed:

$R1(x)=R_3^{(1)}+R_2^{(1)}x+R_1^{(1)}x^2+R_0^{(1)}x^3$.

Next, the 16 inputs ($m_0$, $m_1$ ... $m_{10}$, $m_{11}$, 0, 0, 0, 0) are received sequentially by the second encoding circuit, then 16 outputs are generated correspondingly, and the last 4 outputs as $R_0^{(2)}$, $R_1^{(2)}$, $R_2^{(2)}$, and $R_3^{(2)}$ are defined respectively; the second remainder polynomial (R(x)) is then formed:

$R2(x)=R_0^{(2)}+R_1^{(2)}x+R_2^{(2)}x^2+R_3^{(2)}x^3$.

Next, the coefficients of the second remainder polynomial (R2(x)) are permuted in the reverse order, so as to obtain a third remainder polynomial (R3(x)):

$R3(x)=R_3^{(2)}+R_2^{(2)}x+R_1^{(2)}x^2+R_0^{(2)}x^3$.

Then, the first remainder polynomial (R1(x)) and the third remainder polynomial (R3(x)) are added to obtain the parity code polynomial (R(x)):

$$R(x) = R_3 + R_2x + R_1x^2 + R_0x^3 = R1(x) + R3(x)$$
$$= (R_3^{(1)} + R_3^{(2)}) + (R_2^{(1)} + R_2^{(2)})x + (R_1^{(1)} + R_1^{(2)})x^2 +$$
$$(R_0^{(1)} + R_0^{(2)})x^3.$$

Figure 2:
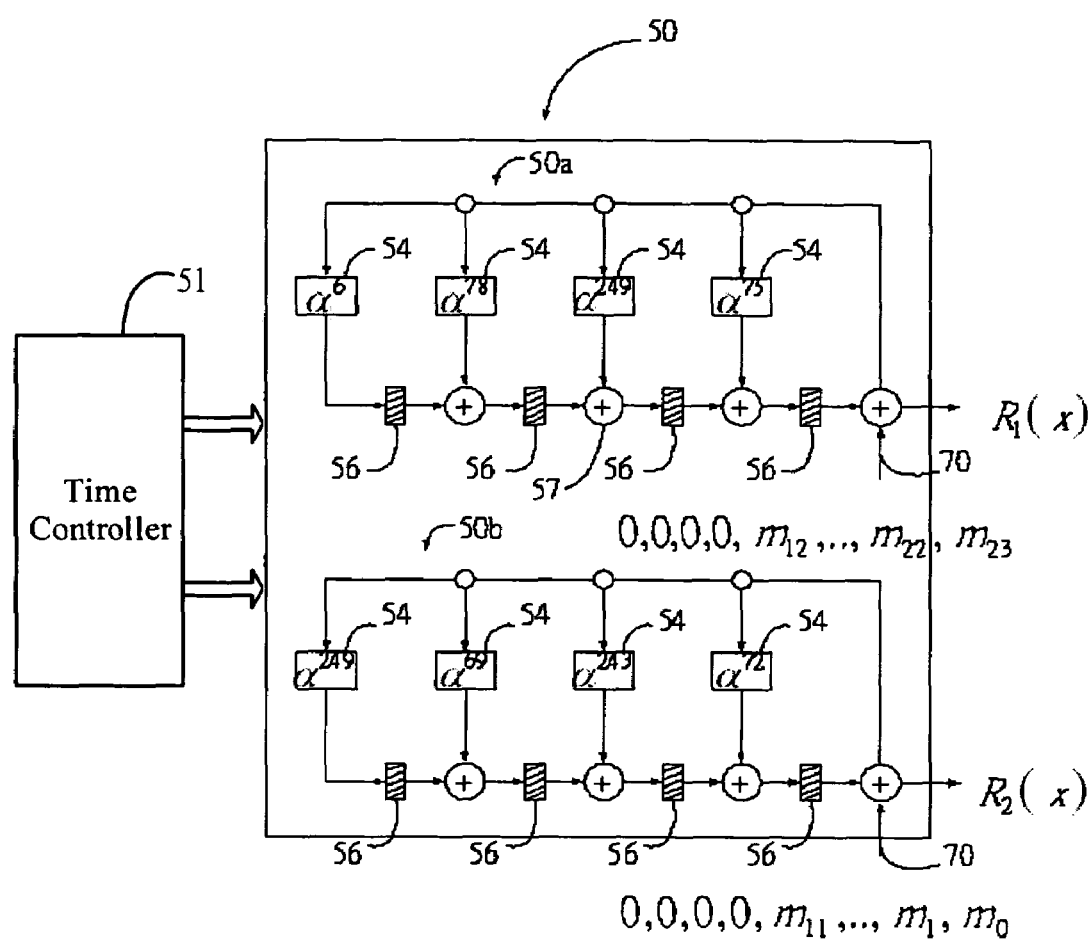
FIG. 2 is a schematic diagram of the encoding apparatus according to the present invention.

Referring to FIG. 2, FIG. 2 is a schematic diagram of the encoding apparatus 50 according to the present invention. In the embodiment shown in FIG. 2, the encoding apparatus 50 of the present invention comprises a timing controller 51, 8 multipliers 54, 8 registers 56, and 8 adders 57. Four multipliers 54, 4 registers 56, an input end 70, and 4 adders 57 form a first encoding circuit 50a; the other 4 multipliers 54, 4 registers 56, an input end 70, and 4 adders 57 form a second encoding circuit 50b. The first encoding circuit 50a and the second encoding circuit 50b share one timing controller 51.

The timing controller 51 is for issuing a timing controlling signal to control operations of the encoding apparatus 50. Each multiplier 54 is used for multiplying an input with a predetermined stored coefficient to obtain a corresponding output. Four registers 56 form 4 stages of serially-cascaded registers 56, and each stage of registers 56 is used for temporarily storing a registered data in the register 56 of the stage and updating the registered data according to the timing controlling signal. Each adder 57 is used for adding an output of the multiplier 54 with the registered data in the register 56 of the previous stage. Each stage of registers 56 is used for temporarily storing an output of a corresponding adder 57 to generate the registered data in the register 56 of the stage.

The initial value of the registers 56 of each encoding circuit (50a and 50b) can be 0 or one of the elements (0, $\alpha^0$, $\alpha^1$ ... $\alpha^{254}$) of the $GF(2^8)$. Since the initial values of the registers 56 are known, the parity code 32 corresponding to the initial values can be calculated; the known initial values of the registers 56 are then subtracted from the parity code 32, and a desired parity code 32 can be obtained.

In the first encoding circuit 50a, first, the coefficients ($\alpha^6$, $\alpha^{78}$, $\alpha^{249}$, and $\alpha^{75}$) of G1(x) are respectively pre-stored into the 4 multipliers 54 from left to right. At this time, the first encoding circuit 50a comprises 4 GF multipliers 54 which has already respectively pre-stored the coefficients ($\alpha^6$, $\alpha^{78}$, $\alpha^{249}$, and $\alpha^{75}$), 4 registers 56, and 4 GF adders 57, and the registered data in the 4 registers 56 are all 0 in the initial state. Then, according to the timing controlling signal, sixteen coefficients ($m_{23}$, $m_{22}$, 0, 0, 0, 0) of the first polynomial (M1(x)) are sequentially accepted at the input end 70, from high order terms to low order terms, as the inputs of the multipliers 54, and 16 outputs are generated correspondingly; the last 4 outputs are defined as $R_3^{(1)}$, $R_2^{(1)}$, $R_1^{(1)}$, and $R_0^{(1)}$ respectively. Finally, the first remainder polynomial: $R1(x)=R_3^{(1)}+R_2^{(1)}x+R_1^{(1)}x^2+R_0^{(1)}x^3$, is formed.

In the second encoding circuit 50b, first, the coefficients ($\alpha^{249}$, $\alpha^{69}$, $\alpha^{243}$, and $\alpha^{72}$) of G2(x) are respectively pre-stored into the 4 multipliers 54 from left to right. At this time, the second encoding circuit 50b comprises 4 GF multipliers 54 which have already respectively pre-stored the coefficients ($\alpha^{249}$, $\alpha^{69}$, $\alpha^{243}$, and $\alpha^{72}$), 4 registers 56, and 4 GF adders 57. According to the timing controlling signal, sixteen coefficients ($m_0$, $m_1$ ... $m_{11}$, 0, 0, 0, 0) of the third polynomial (M3(x)) are sequentially accepted at the input end 70, from high order terms to low order terms, and 16 outputs are generated correspondingly; the last 4 outputs are defined as $R_0^{(2)}$, $R_1^{(2)}$, $R_2^{(2)}$, and $R_3^{(2)}$ respectively. Then, the second remainder polynomial: R2(x)=$R_0^{(2)}$+$R_1^{(2)}$x+$R_2^{(2)}$$x^2$+$R_3^{(2)}$$x^3$, is formed. Finally, the coefficients remainder polynomial (R2(x)) are permuted in the reverse order to obtain a third remainder polynomial: R3(x)=$R_3^{(2)}$+$R_2^{(2)}$x+$R_1^{(2)}$$x^2$+$R_0^{(2)}$$x^3$.

The first remainder polynomial (R1(x)) and the third remainder polynomial (R3(x)) are summed up to obtain the parity code polynomial (R(x)):

$$R(x) = R_3 + R_2 x + R_1 x^2 + R_0 x^3 = R1(x) + R3(x)$$
$$= (R_3^{(1)} + R_3^{(2)}) + (R_2^{(1)} + R_2^{(2)})x + (R_1^{(1)} + R_1^{(2)})x^2 +$$
$$(R_0^{(1)} + R_0^{(2)})x^3.$$

From the coefficients ($R_3$, $R_2$, $R_1$, and $R_0$) of each term of the parity code polynomial (R(x)), the corresponding values can be calculated with the mapping relationship, so as to obtain the parity code 32.

The above-mentioned embodiment uses two encoding circuit to operate, and each encoding circuit is not complicated; therefore, the present invention can decrease the system complexity. Besides, the present invention is the encoding method of CIRC; the encoding calculation is much simpler and time-saving.

The present invention is also able to perform encoding operations by single encoding circuit that means when the coefficients M1(x) and M3(x) are inputted in the calculation, the coefficients of G1(x) and G2(x) can be sequentially stored into multipliers 54, so as to obtain the same efficiency.

Figure 3:
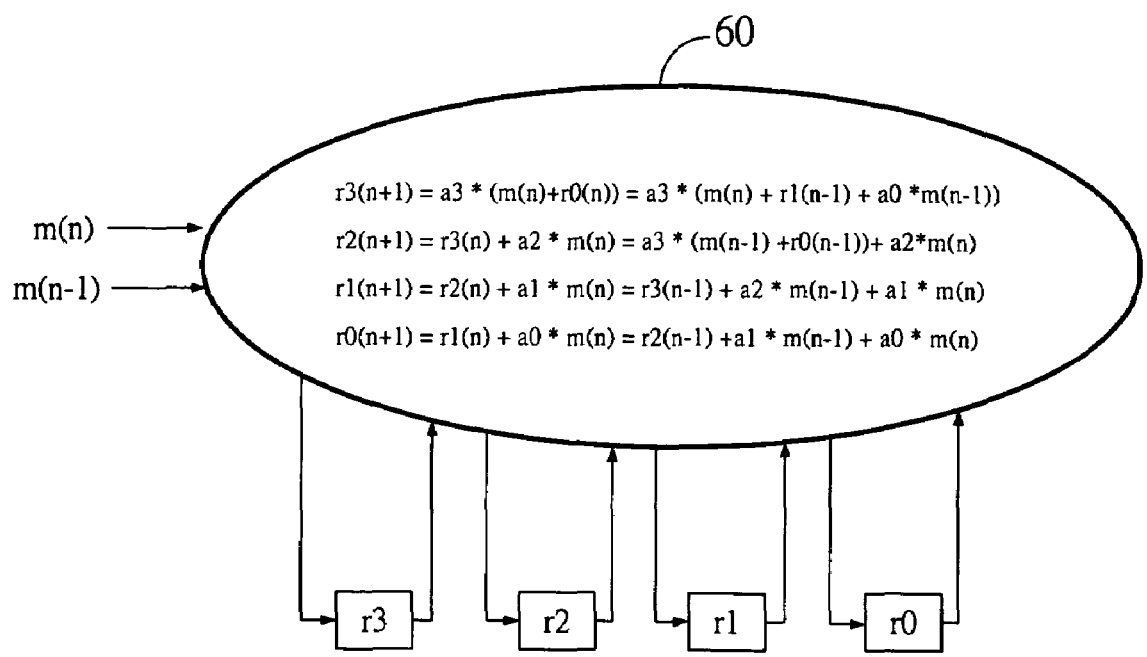
FIG. 3 is a schematic diagram of one embodiment of the present invention.

Referring to FIG. 3, FIG. 3 is a schematic diagram of the encoding circuit 60 and the polynomials of the encoding apparatus 50 of another embodiment according to the present invention. The encoding circuit 60 in FIG. 3 can replace the encoding circuits (50a and 50b) in FIG. 2. In the encoding circuit 60, two data can be inputted at the same time; that means two data can be handled in one timing. From the formula shown in FIG. 3, when m(n−1) and m(n) and the remainders (r3(n−1), r2(n−1), r1(n−1), and r0(n−1)) of the previous time are inputted, the remainders (r3(n+1), r2(n+1), r1(n+1), and r0(n+1)) of the next time can be directly obtained. When m(n−1) and m(n) are inputted at the same cycle, the remainder results, after calculating for two steps, can be obtained after one cycle. Wherein (n) represents the present cycle, (n−1) represents the cycle of the previous time, (n+1) represents the cycle of the next time, and so on. The circuit, which is able to input more than three data, can be obtained in a similar method.

The encoding method of the present invention can also be performed by the digital signal processor (DSP).

According to the above description, the encoding apparatus 50 and the method of the present invention is used for encoding a codeword 30 by an encoding method of CIRC to obtain a corresponding parity code 32. By the method of the present invention, not only is the necessary calculating cycle decreased, but the system complexity is decreased too.

With the example and explanations above, the features and spirits of the invention will be hopefully well described.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An encoding method for encoding a codeword to obtain a corresponding parity code, the parity code being embedded in the codeword and dividing the codeword to have intermediate symbol locations between a first and a second set of data symbols, each data symbol forming a coefficient, the first set of data symbols, the second set of data symbols, and the parity code respectively forming a first polynomial (M1(x)), a second polynomial (M2(x)), and a parity code polynomial (R(x)), the encoding method comprising the following steps:

designing a first code generator polynomial (G1(x)) according to a desired parity resolution;

multiplying the first polynomial (M1(x)) by $x^4$ and dividing a product of M1(x)*$x^4$ by the first code generator polynomial (G1(x)), so as to obtain a first remainder polynomial (R1(x));

generating a second code generator polynomial (G2(x)) from the first code generator polynomial (G1(x)) according to a reciprocal substitution procedure;

generating a third polynomial (M3(x)), wherein the coefficients of the third polynomial (M3(x)) in the ascending order are the reverse permuted order of the coefficients of the second polynomial (M2(x)) in the ascending order;

multiplying the third polynomial (M3(x)) by $x^4$ and dividing a product of M3(x)*$x^4$ by the second code generator polynomial (G2(x)), so as to obtain a second remainder polynomial (R2(x));

performing an adding procedure to the first remainder polynomial (R1(x)) and the second remainder polynomial (R2(x)), so as to obtain the parity code polynomial (R(x)); and obtaining the parity code from each coefficient of the parity code polynomial (R(x)).

2. The encoding method of claim 1, wherein the codeword is the cross interleaved Reed-Solomon cyclic code (CIRC) utilized in a compact disc.

3. The encoding method of claim 1, wherein the first and the second set of data symbols comprise 12 data symbols respectively, and the parity code comprises 4 data symbols.

4. The encoding method of claim 1, wherein each data symbol is an 8-bit digital data, and the value of each data symbol is selected from 0 to 255.

5. The encoding method of claim 4, wherein the values of the data symbols are mapped to the elements of a Galois Field (GF($2^8$)) through a predetermined mapping relationship, and the values of the data symbols range from 0 to 255, and are respectively mapped to the 256 elements (0, $\alpha^0$, $\alpha^1$ ... $\alpha^{254}$) of the GF($2^8$).

6. The encoding method of claim 5, wherein the encoding method utilizes the 256 elements (0, $\alpha^0$, $\alpha^1$ ... $\alpha^{254}$) of the GF($2^8$) to replace the value of the data symbols, so as to form the coefficients for the polynomial calculation.

7. The encoding method of claim 6, wherein, after the encoding method calculates the parity code polynomial (R(x)) by the elements of the GF($2^8$), the coefficients of the parity code polynomial (R(x)) are utilized to obtain corresponding values via the predetermined mapping relationship, so as to form the parity code.

8. The encoding method of claim 5, wherein the first polynomial is expressed as follows:

$$M1(x)=m_{23}x^{11}+m_{22}x^{10}+\ldots+m_{13}x+m_{12};$$

the second polynomial is expressed as follows:

$$M2(x)=m_{11}x^{11}+m_{10}x^{10}+\ldots+m_1x+m_0;$$

the third polynomial is expressed as follows:

$$M3(x)=m_0x^{11}+m_1x^{10}+\ldots+m_{10}x+m_{11};$$

wherein the coefficients ($m_0 \ldots m_{23}$) are selected from the elements ($0, \alpha^0, \alpha^1 \ldots \alpha^{254}$) of the $GF(2^8)$; and the first code generator polynomial is expressed as follows:

$$G1(x)=(x+\alpha^0)(x+\alpha^1)(x+\alpha^2)(x+\alpha^3)=\alpha^6+\alpha^{78}x+\alpha^{249}x^2+\alpha^{75}x^3+x^4;\text{ and}$$

the second code generator polynomial is expressed as follows:

$$G2(x)=(x+\alpha^0)(x+\alpha^{-1})(x+\alpha^{-2})(x+\alpha^{-3})=\alpha^{249}+\alpha^{69}x+\alpha^{243}x^2+\alpha^{72}x^3+x^4.$$

9. The encoding method of claim 6, wherein the encoding method is employed in a first encoding circuit and a second encoding circuit, and the adding procedure comprises the following steps:

receiving 16 inputs ($m_{23}, m_{22} \ldots m_{13}, m_{12}, \mathbf{0, 0, 0, 0}$) sequentially by the first encoding circuit, then generating 16 outputs correspondingly, and defining the last 4 outputs as $R_3^{(1)}, R_2^{(1)}, R_1^{(1)}$, and $R_0^{(1)}$ respectively, then the first remainder polynomial (R1(x)) being formed:

$$R1(x)=R_3^{(1)}+R_2^{(1)}x+R_1^{(1)}x^2+R_0^{(1)}x^3;$$

receiving the 16 inputs ($m_0, m_1 \ldots m_{10}, m_{11}, \mathbf{0, 0, 0, 0}$) sequentially by the second encoding circuit, then generating 16 outputs correspondingly, and defining the last 4 outputs as $R_0^{(2)}, R_1^{(2)}, R_2^{(2)}$, and $R_3^{(2)}$) respectively, then the second remainder polynomial (R2(x)) being formed:

$$R2(x)=R_0^{(2)}+R_1^{(2)}x+R_2^{(2)}x^2+R_3^{(2)}x^3;$$

permuting the coefficients of the second remainder polynomial (R2(x)) in the reverse order, so as to obtain a third remainder polynomial (R3(x)):

$$R3(x)=R_3^{(2)}+R_2^{(2)}x+R_1^{(2)}x^2+R_0^{(2)}x^3;$$

and adding the first remainder polynomial (R1(x)) and the third remainder polynomial (R3(x)) to obtain the parity code polynomial (R(x)):

$$R(x)=R_3+R_2x+R_1x^2+R_0x^3=R1(x)+R3(x)=(R_3^{(1)}+R_3^{(2)})+(R_2^{(1)}+R_{(2)}^{(2)})x+(R_1^{(1)}+R_1^{(2)})x^2+(R_0^{(1)}+R_0^{(2)})x^3.$$

10. The encoding method of claim 1, wherein, when the higher the desired parity resolution is, the more terms the first code generator polynomial has and the longer the parity code becomes.

* * * * *